United States Patent
Swart et al.

(10) Patent No.: US 6,318,267 B1
(45) Date of Patent: Nov. 20, 2001

(54) INTEGRATED CIRCUIT CONFIGURATION AND IGNITION UNIT

(75) Inventors: Marten Swart, Obertraubling (DE); Hubert Rothleitner, Villach (AT)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/596,424

(22) Filed: Jun. 19, 2000

Related U.S. Application Data

(63) Continuation of application No. PCT/DE98/03214, filed on Nov. 4, 1998.

(30) Foreign Application Priority Data

Dec. 18, 1997 (DE) ............................................. 197 56 603

(51) Int. Cl.$^7$ .................................. F42C 19/08; F42B 3/13
(52) U.S. Cl. ...................................... 102/202.5; 102/202.5; 102/202.6; 102/202.7; 102/202.4; 102/202.8
(58) Field of Search ........................... 102/202.5, 202.6, 102/202.7, 202.4, 202.8; 361/502, 433

(56) References Cited

U.S. PATENT DOCUMENTS

| | | | |
|---|---|---|---|
| 3,656,027 | * 4/1972 | Isley | 317/230 |
| 4,052,271 | * 10/1977 | Beer | 204/38 A |
| 4,327,400 | * 4/1982 | Muranaka et al. | 361/433 |
| 4,733,328 | * 3/1988 | Blazej | 361/320 |
| 4,819,560 | 4/1989 | Patz et al. . | |
| 4,840,122 | * 6/1989 | Nerheim | 102/202.5 |
| 4,923,826 | * 5/1990 | Jastrzebski et al. | 437/57 |
| 4,976,200 | * 12/1990 | Benson et al. | 102/202.7 |
| 5,309,841 | 5/1994 | Hartman et al. . | |
| 5,798,475 | * 8/1998 | Reynes et al. | 102/202.5 |
| 5,800,857 | * 9/1998 | Ahmad et al. | 427/80 |
| 5,867,363 | * 2/1999 | Tsai et al. | 361/502 |
| 5,882,034 | * 3/1999 | Davis et al. | 280/735 |
| 5,912,427 | * 6/1999 | Willis et al. | 102/202.8 |
| 5,992,236 | * 11/1999 | Martinez-Tovar et al. | 102/202.4 |

FOREIGN PATENT DOCUMENTS

| | | |
|---|---|---|
| 0 296 348 | 12/1988 | (EP) . |
| 0 471 871 B1 | 1/1994 | (EP) . |

OTHER PUBLICATIONS

"Thin solid films" (Lehmann et al.), Siemens AG, Department ZFE, 81730 München, Germany, pp. 138–142, as mentioned on p. 2 of the specification.

* cited by examiner

*Primary Examiner*—Charles T. Jordan
*Assistant Examiner*—Lulit Semunegus
(74) *Attorney, Agent, or Firm*—Herbert L. Lerner; Laurence A. Greenberg; Werner H. Stemer

(57) ABSTRACT

An integrated circuit configuration, in particular for igniting a restraint device of a motor vehicle, has a capacitor and an ignition element. In this case, a porous region of a semiconductor layer forms a capacitor electrode, which is isolated from a further semiconductor layer by a dielectric layer. The further semiconductor layer being configured as a further capacitor electrode. The further semiconductor layer has a region that is tapered in its cross-section and serves as an ignition element electrically connected to the capacitor.

12 Claims, 2 Drawing Sheets

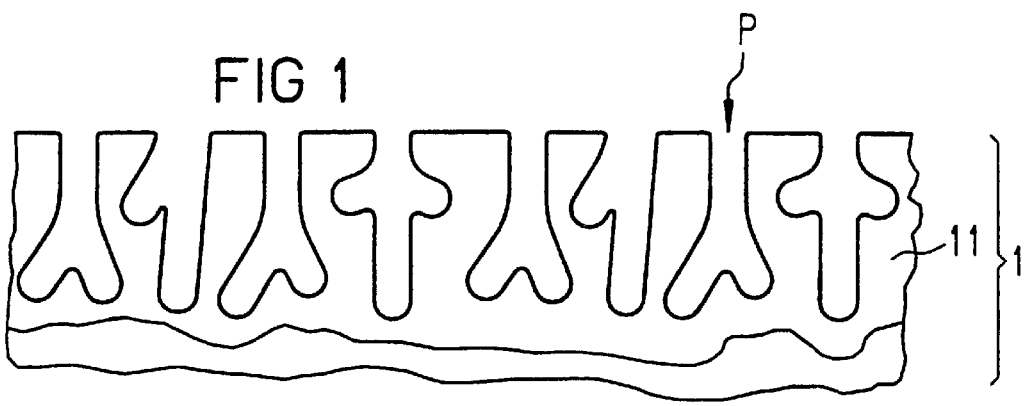
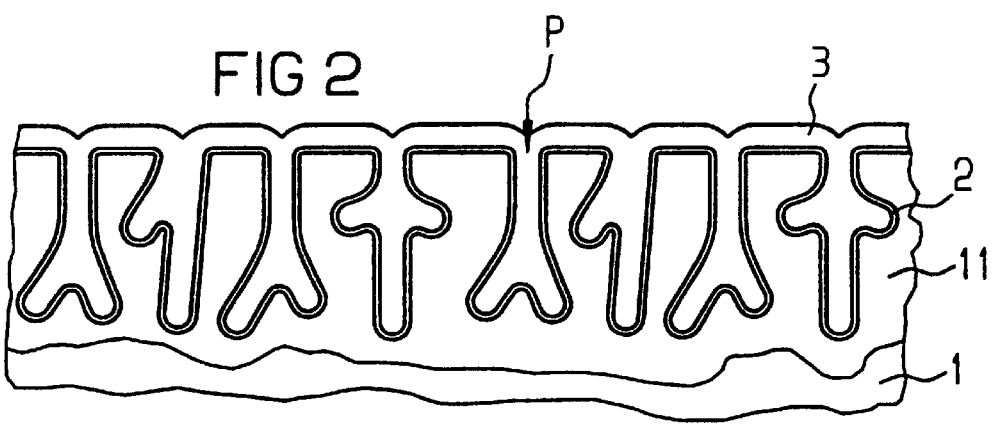
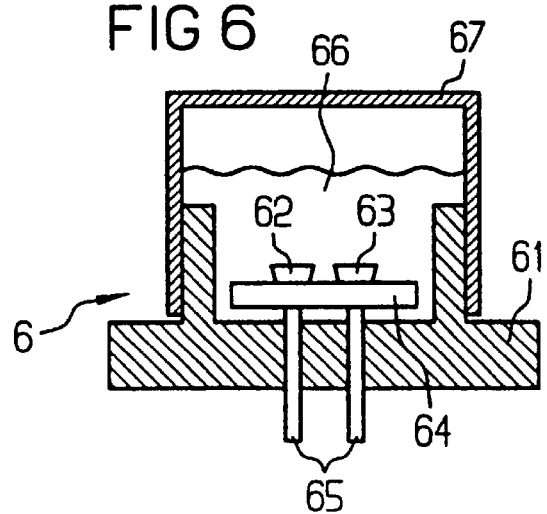

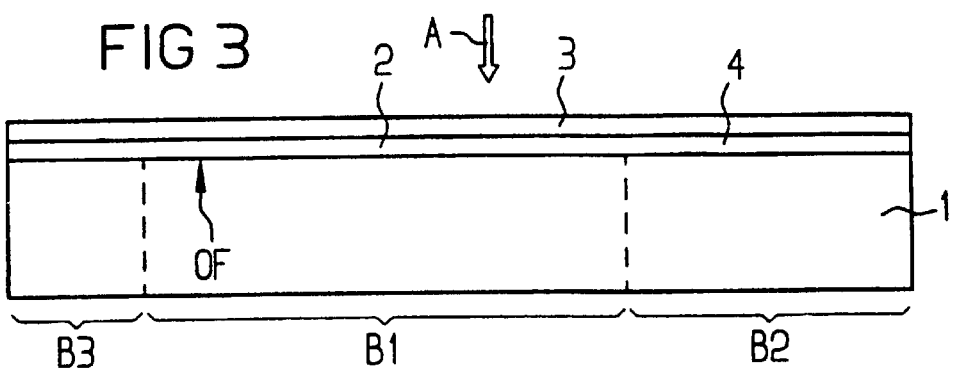
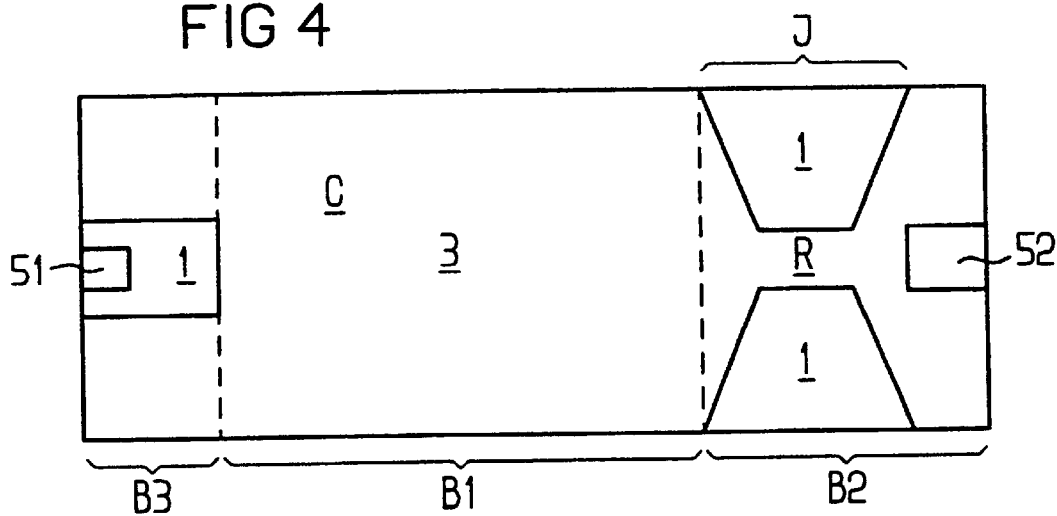
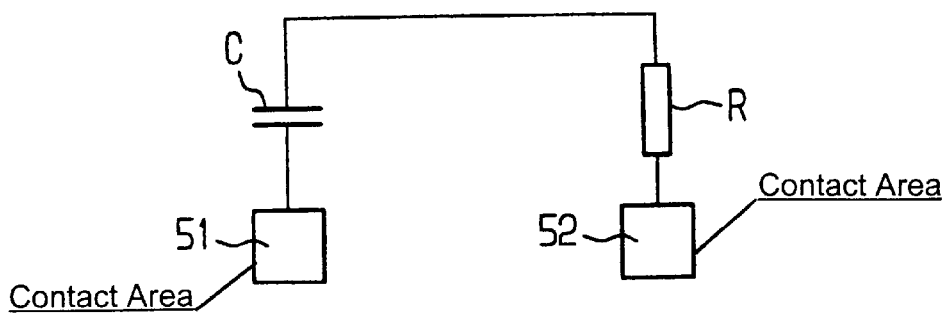

US 6,318,267 B1

INTEGRATED CIRCUIT CONFIGURATION AND IGNITION UNIT

CROSS REFERENCE TO RELATED TO RELATED APPLICATION

This is a continuation of copending International Application PCT/DE98/03214, filed Nov. 4, 1998, which designated the United States.

BACKGROUND OF THE INVENTION

1. Field of the Invention

The invention relates to an integrated circuit configuration and to an ignition unit.

European Patent EP 0 471 871 B1 discloses an occupant protection system for motor vehicles in which a control unit disposed in a centralized manner in the motor vehicle controls, via a data bus, igniters disposed in an occupant protection device such as an airbag, a seat belt pretensioner, etc. Each igniter has a resistance heating wire that is embedded in an ignition material and is connected to an energy storage capacitor via a controllable power stage. A control circuit of the igniter receives messages communicated via the data bus and switches the power stage on in the event of an ignition command. With the result that the energy stored in the capacitor in the form of a current heats the resistance heating element and thus causes the ignition material to explode. The liberated energy in turn releases gas that is compressed in pellets and fills an airbag, for example.

Capacitors have been able to be integrated in silicon for a number of years. To date, however, the integrated capacitors have been distinguished by a relatively low capacitance. The applicant therefore proposed an integrated circuit configuration having a capacitor whose storage capacitance approaches that of conventional, discrete capacitors (see V. Lehmann et al., titled "A Novel Capacitor Technology Based On Porous Silicon" in Thin Solid Films, 276 (1996), Pages 138–142). In this case, pores are produced electrochemically in a semiconductor substrate—called a semiconductor layer below. The pores are covered with a dielectric layer and a polysilicon layer. The semiconductor layer and the polysilicon layer form capacitor electrodes. The capacitance of known integrated capacitors is significantly increased on account of the formation of pores.

SUMMARY OF THE INVENTION

It is accordingly an object of the invention to provide an integrated circuit configuration and an ignition unit, that overcome the above-mentioned disadvantages of the prior art devices of this general type, which has a small ignition unit containing a capacitor and an ignition element configured as a heating resistor, which ignition unit can be produced with a small outlay.

With the foregoing and other objects in view there is provided, in accordance with the invention, an integrated circuit configuration, including:

a semiconductor layer functioning as a first capacitor electrode, the semiconductor layer having a porous region formed therein;

a dielectric layer disposed on the semiconductor layer; and a further semiconductor layer functioning as a second capacitor electrode disposed on the dielectric layer, the first capacitor electrode, the dielectric layer and the second capacitor electrode form a capacitor in the porous region of the semiconductor layer, the further semiconductor layer having a region tapered in its cross-section serving as an ignition element connected to the capacitor.

In accordance with an added feature of the invention, the further semiconductor layer is a polysilicon layer.

In accordance with an additional feature of the invention, the semiconductor layer has a nonporous region, and the region of the further semiconductor layer being a tapered region extending over the nonporous region of the semiconductor layer.

In accordance with another feature of the invention, there is a contact area disposed on an area of the semiconductor layer that is free of the dielectric layer and the further semiconductor layer.

In accordance with a further added feature of the invention, the semiconductor layer has a nonporous region, and including a further contact area disposed on the further semiconductor layer above the nonporous region of the semiconductor layer.

In accordance with a further additional feature of the invention, the ignition element has a resistance in a range of from 0.5 to 20 ohms.

In accordance with another added feature of the invention, the capacitor has a capacitance greater than 0.8 $\mu F$.

In accordance with another additional feature of the invention, the capacitor has a capacitance of less than 0.8 $\mu F$.

In accordance with a concomitant feature of the invention, the semiconductor layer has a nonporous region, and including a insulating layer disposed between and isolating the semiconductor layer from the further semiconductor layer, and the insulating layer is a partial layer of the dielectric layer.

With the foregoing and other objects in view there is further provided, in an occupant protection device of a motor vehicle in accordance with the invention, an ignition unit for igniting the occupant protection device, the ignition unit including:

a semiconductor layer functioning as a first capacitor electrode, the semiconductor layer having a porous region formed therein;

a dielectric layer disposed on the semiconductor layer;

a further semiconductor layer functioning as a second capacitor electrode disposed on the dielectric layer, the first capacitor electrode, the dielectric layer and the second capacitor electrode forming a capacitor in the porous region of the semiconductor layer;

an ignition material; and the further semiconductor layer having a region tapered in its cross-section and serves as an ignition element connected to the capacitor, the capacitor storing electrical energy for heating the ignition element, the ignition element, in an event of current throughflow, igniting the ignition material thermally coupled to the ignition element.

In accordance with a preferred embodiment of the invention, the capacitor has a capacitance dimensioned such that energy stored in the capacitor is less than a quantity of energy that is required for igniting the ignition material. Alternatively, the capacitor can have a capacitance dimensioned such that energy stored in the capacitor suffices for igniting the ignition material.

Other features which are considered as characteristic for the invention are set forth in the appended claims.

Although the invention is illustrated and described herein as embodied in an integrated circuit configuration and an ignition unit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 1 and 2 are diagrammatic, sectional views of an integrated circuit configuration in a production process according to the invention;

FIG. 3 is a cross-sectional view of the integrated circuit configuration;

FIG. 4 is a plan view of the integrated circuit configuration;

FIG. 5 is a block circuit diagram being an electrical equivalent of the circuit configuration according to FIG. 3; and FIG. 6 is a sectional view of an igniter for an occupant protection system using the integrated circuit configuration.

DESCRIPTION OF THE PREFERRED EMBODIMENTS

In all the figures of the drawing, sub-features and integral parts that correspond to one another bear the same reference symbol in each case. Referring now to the figures of the drawing in detail and first, particularly, to FIG. 1 thereof, there is shown an exemplary embodiment having a semiconductor layer 1 containing n-doped silicon. The dopant concentration of the silicon is approximately $10^{18}$ cm$^{-3}$. The semiconductor layer 1 is connected to a first voltage terminal and immersed in a hydrofluoric acid solution (25% by weight). An electrode connected to a second voltage terminal is situated in the hydrofluoric acid solution. A voltage of approximately 2 volts is subsequently produced between the first voltage terminal and the second voltage terminal. The voltage difference between the first voltage terminal and the second voltage terminal is positive. The resulting current density is approximately 100 mA/cm$^2$. After a few minutes, pores P having a width of approximately 100 nm and a depth of a few $\mu$m are produced in the semiconductor layer or substrate 1. After the desired pore depth has been reached, the electrochemical etching is ended. Distances between centers of adjacent pores P are about the same and are approximately 20 nm. The pores P are disposed spatially irregularly.

In order to produce a heavily doped layer 11 in the semiconductor layer 1, phosphosilicate glass, as a dopant source, is deposited to a thickness of a few nm onto a surface of the semiconductor layer 1. The dopant is subsequently outdiffused, by heat treatment, from the phosphosilicate glass into the semiconductor layer 1 approximately to a depth of 100 nm, the layer 11 thereby being produced. The layer 11 is n-doped and its dopant concentration is approximately $10^{20}$ cm$^{-3}$. The layer 11 is suitable as a capacitor plate for capacitors.

The phososilicate glass is subsequently removed. A suitable etchant is HF, for example.

In order to produce a capacitor dielectric layer 2, an oxide-nitride-oxide (ONO) layer is produced. In this case, the oxide is a silicon oxide and the nitride is silicon nitride.

To that end, first a silicon oxide layer having a thickness of approximately 2 nm is grown by thermal oxidation. Approximately 4 nm of silicon nitride is then deposited, this being oxidized to a depth of approximately 2 nm (see FIG. 2).

In order to produce a further capacitor electrode 3, doped polysilicon is subsequently deposited as a further semiconductor layer to a thickness of 5 nm (see FIG. 2).

Such a silicon capacitor is described in more detail in the technical article already acknowledged in the introduction to the description titled: "A Novel Capacitor Technology Based On Porous Silicon" by V. Lehmann et al., in Thin Solid Films, 276 (1996), Pages 138–142. The content of this technical article, in particular relating to the capacitor structure and the production process, is hereby deemed to be incorporated by reference.

FIG. 3 shows an exemplary embodiment of the integrated circuit configuration in cross-section. In this case, the semiconductor layer 1 contains a region B1 containing the pores P (not illustrated) in accordance with FIGS. 1 and 2, the pores P having their openings directed toward the surface OF of the semiconductor layer 1. Regions B2 and B3 of the semiconductor layer 1 do not have the pores P. In the regions B1 and B3, a symbolically indicated dielectric layer 2 is applied on the semiconductor layer 1 and hence, of course, also on the inner walls of the pores P in accordance with FIG. 2. The further semiconductor layer 3 configured as a polysilicon layer is in turn disposed on the dielectric layer 2. An insulating layer 4 is provided on the semiconductor layer 1 only in the nonporous region B2, and is in turn covered by the polysilicon layer 3.

FIG. 4 shows a plan view of the integrated circuit configuration according to FIG. 3 from the direction A. The patterning of the topmost polysilicon layer 3 can be seen in particular in this case. In the porous region B1 of the semiconductor layer 1, the polysilicon layer 3 entirely covers the underlying dielectric layer 2. The polysilicon layer 3, the dielectric layer 2 and the underlying semiconductor layer 1 form a capacitor C in the porous region B1, the capacitor C composed of many partial capacitors on account of its pore structure. The nonporous region B3 serves for making electrical contact with the semiconductor layer 1. To that end, a partial area of the polysilicon layer 3 and of the dielectric layer 2 is etched away in the region B3. A contact area 51 is applied to the etched-free semiconductor layer 1, which can also be seen in FIG. 4.

The likewise nonporous region B2 of the semiconductor layer 1 likewise has two areas that have been etched free from the polysilicon layer 3 and the underlying insulating layer 4. As a result, the polysilicon layer 3 has a region J that is tapered in its cross-section. Such a shaping of the polysilicon layer 3 produces an ignition element R in the form of a heating resistor bridge in the region B2. The location J that is tapered in such a way ensures that the electrical energy in the form of a current flowing from the capacitor C via the tapered location J is converted into thermal energy precisely at the tapered, low-resistance location J and thereby causes an ignition material/ignition powder disposed at/in the tapered region J to explode. The tapered region J need not have the form in accordance with FIG. 4. By way of example, the tapering may also consist in a reduction of the height of the polysilicon layer 3. The cross-sectional area of the polysilicon layer 3 is at any rate smaller in the tapered region J—that is to say the region in which the heating effect is to be obtained—than in the region B1, in which the polysilicon layer 3 principally acts as the capacitor electrode.

Furthermore, a further contact area 52 is applied to the polysilicon layer 3 in the region B2.

If the polysilicon layer 3 serves as the capacitor electrode in interaction with the dielectric layer 2 and the porous semiconductor layer 1 in the region B1, then the same polysilicon layer 3 serves as an ignition element R in the region B2. An electrical equivalent circuit diagram according to FIG. 5 results for the circuit configuration according to the invention according to FIGS. 3 and 4. In this case, between the contact areas 51 and 52, the integrated silicon capacitor C is disposed in series with the ignition resistor R which is disposed on the same substrate and uses the same polysilicon layer 3.

The advantages of the integrated circuit configuration according to the invention reside in its small construction and in its method of production in only a small number of production steps. A mechanically and electrically susceptible connection, which is complicated to produce, between a discrete resistor and a discrete capacitor is omitted. A single component contains the capacitor and the resistor, the resistance decreasing during the production of the capacitor without any additional outlay.

The integrated circuit configuration according to the invention according to the exemplary embodiment in FIGS. 3 and 4 can, of course, be modified in diverse ways: thus, the regions B2 and B3 may also contain the pores P. The areas of the semiconductor layer 1 which are covered with the polysilicon layer 3 and the dielectric layer 2 then also contribute to a capacitance of the capacitor C. The insulating layer 4 in the region B2 is preferably a silicon oxide layer. In this case, a silicon oxide layer of the dielectric layer 2 is preferably used. In a further embodiment, the dielectric layer 2 may also be disposed in the region B2. Depending on the use of the integrated circuit configuration, the capacitances that occur in this case between the polysilicon layer 3 and the nonporous semiconductor layer in the region B2 are negligible.

The contact areas 51 and 52 may be configured as bonding pads for bonding connection to further electrical circuit configurations. If the integrated circuit configuration according to FIG. 3 is disposed in this form on a circuit carrier and, at the same time, covers a contact area on the circuit carrier, then the semiconductor layer 1 of the contact area 51 may be disposed at a suitable location for direct connection to the circuit carrier. The contact areas 51 and 52 may, in particular, also be configured in such a way that the integrated circuit configuration is placed onto further circuit configurations or circuit carriers using flip-chip technology.

FIG. 6 shows a use of an integrated circuit configuration 62 according to the invention in an igniter 6 for an occupant protection device. The igniter 6 is disposed in a housing of a gas generator, which is in turn mechanically coupled to an airbag to be inflated. The igniter 6 essentially contains a housing formed of a holder 61 and a cap 67. The holder 61 and the cap 67 together form a chamber filled with an ignition material 66—in particular an ignition powder. Furthermore, a circuit carrier 64 is disposed inside the chamber on the holder 61, the circuit carrier 64 containing the integrated circuit configuration 62 according to the invention as an ignition unit and also an integrated control circuit 63 provided for driving the integrated control configuration 62. Connection pins 65 are electrically conductively connected to the circuit carrier 64 and are guided through the holder 61. Messages arriving via the connection pins 65 are evaluated in the integrated control circuit 63. If the intention is to obtain ignition of the igniter 6, then the integrated control circuit 63 switches on a non-illustrated controllable power switch. As a result, the energy of the capacitor C is transferred to the ignition resistor R.

What has an advantageous effect in the context of the use of the integrated circuit configuration according to the invention as the ignition unit is the fact, in particular, that no exposed lines at all are routed between the ignition resistor R and the capacitor C, which lines would require a separate overvoltage protection for the ignition resistor R in order to avoid instances of erroneous triggering.

In an advantageous manner, the integrated control circuit 63 may also be disposed on the same semiconductor layer 1 for the capacitor C and the resistor R.

A typical resistance range for the use of the resistor R as a heating resistor is about 1 to 20 ohms. When the resistor R is configured as a resistance bridge, in accordance with FIG. 4 a maximum heating effect and hence a maximum efficiency in the event of ignition are achieved in the event of a current flow via this constriction.

The capacitance of the capacitor C and hence the extent of the porous region B1 and/or pore depth and pore spacing depend on the energy required for ignition of the igniter 6. Therefore, the energy stored in the capacitor C must always be sufficient so that the resistor R can be heated to a sufficient extent when the controllable power stage is switched on. In a further ignition method, a capacitor C connected in series with the ignition resistor R has a much smaller capacitance than would be required to store sufficient energy for the ignition of the resistor R. In a push-pull method, the capacitor C is continuously charged and discharged during the ignition operation. Thus, small portions of energy are fed to the ignition resistor R within a short time. Each individual portion of energy would not be sufficient by itself for ignition, but the sum of the portions of energy over a short time does transport a sufficient quantity of energy to the resistor R.

We claim:

1. An integrated circuit configuration, comprising:
   a semiconductor layer functioning as a first capacitor electrode, said semiconductor layer having a porous region formed therein;
   a dielectric layer disposed on said semiconductor layer; and
   a further semiconductor layer functioning as a second capacitor electrode disposed on said dielectric layer, said first capacitor electrode, said dielectric layer and said second capacitor electrode forming a capacitor in said porous region of said semiconductor layer, said further semiconductor layer having a region tapered in its cross-section serving as an ignition element connected to said capacitor.

2. The integrated circuit configuration according to claim 1, wherein said further semiconductor layer is a polysilicon layer.

3. The integrated circuit configuration according to claim 1, wherein said semiconductor layer has a nonporous region, and said region of said further semiconductor layer being a tapered region extending over said nonporous region of said semiconductor layer.

4. The integrated circuit configuration according to claim 1, including a contact area disposed on an area of said semiconductor layer that is free of said dielectric layer and said further semiconductor layer.

5. The integrated circuit configuration according to claim 4, wherein said semiconductor layer has a nonporous region, and including a further contact area disposed on said further semiconductor layer above said nonporous region of said semiconductor layer.

6. The integrated circuit configuration according to claim 1, wherein said ignition element has a resistance in a range of from 0.5 to 20 ohms.

7. The integrated circuit configuration according to claim 1, wherein said capacitor has a capacitance greater than 0.8 $\mu$F.

8. The integrated circuit configuration according to claim 1, wherein said capacitor has a capacitance of less than 0.8 $\mu$F.

9. The integrated circuit configuration according to claim 1, wherein said semiconductor layer has a nonporous region, and including a insulating layer disposed between and isolating said semiconductor layer from said further semiconductor layer, and said insulating layer is a partial layer of said dielectric layer.

10. In an occupant protection device of a motor vehicle, an ignition unit for igniting the occupant protection device, the ignition unit comprising:

a semiconductor layer functioning as a first capacitor electrode, said semiconductor layer having a porous region formed therein;

a dielectric layer disposed on said semiconductor layer;

a further semiconductor layer functioning as a second capacitor electrode disposed on said dielectric layer, said first capacitor electrode, said dielectric layer and said second capacitor electrode forming a capacitor in said porous region of said semiconductor layer;

an ignition material; and said further semiconductor layer having a region tapered in its cross-section and serves as an ignition element connected to said capacitor, said capacitor storing electrical energy for heating said ignition element, said ignition element, in an event of current throughflow, igniting said ignition material thermally coupled to said ignition element.

11. The ignition unit according to claim 10, wherein said capacitor has a capacitance dimensioned such that energy stored in said capacitor is less than a quantity of energy which is required for igniting said ignition material.

12. The ignition unit according to claim 10, wherein said capacitor has a capacitance dimensioned such that energy stored in said capacitor suffices for igniting said ignition material.

* * * * *